US011263737B2

(12) United States Patent
Sawlani et al.

(10) Patent No.: US 11,263,737 B2
(45) Date of Patent: Mar. 1, 2022

(54) DEFECT CLASSIFICATION AND SOURCE ANALYSIS FOR SEMICONDUCTOR EQUIPMENT

(71) Applicant: Lam Research Corporation, Fremont, CA (US)

(72) Inventors: Kapil Sawlani, San Jose, CA (US); Richard A. Gottscho, Pleasanton, CA (US); Michal Danek, Cupertino, CA (US); Keith Wells, Santa Cruz, CA (US); Keith Hansen, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 389 days.

(21) Appl. No.: 16/245,040

(22) Filed: Jan. 10, 2019

(65) Prior Publication Data
US 2020/0226742 A1     Jul. 16, 2020

(51) Int. Cl.
G06T 7/00       (2017.01)
H01L 21/67      (2006.01)
H01L 21/66      (2006.01)

(52) U.S. Cl.
CPC ...... *G06T 7/0004* (2013.01); *H01L 21/67288* (2013.01); *G06T 2207/30148* (2013.01); *H01L 22/20* (2013.01)

(58) Field of Classification Search
CPC ............... G06T 7/00; G06T 7/0004; G06T 2207/30148; H01L 21/67288; H01L 22/20; H01L 22/12
See application file for complete search history.

(56) References Cited

U.S. PATENT DOCUMENTS

| 6,744,266 B2* | 6/2004 | Dor ................. H01L 22/20 257/E21.525 |
| 7,333,650 B2 | 2/2008 | Yamamoto et al. |
| 10,483,081 B2* | 11/2019 | Park ..................... G06K 9/6267 |
| 10,529,534 B2* | 1/2020 | Pathangi Sriraman ...... G06N 3/0472 |

(Continued)

FOREIGN PATENT DOCUMENTS

| EP | 1269264 B1 * | 3/2011 | ............... G03F 1/70 |
| JP | 2009-070834 | 4/2009 | |

(Continued)

OTHER PUBLICATIONS

Notification of Transmittal and International Search Report and the Written Opinion of the International Searching Authority, dated May 7, 2020, for PCT/US2020/013041.

(Continued)

*Primary Examiner* — Tung S Lau
(74) *Attorney, Agent, or Firm* — Weaver Austin Villeneuve & Sampson LLP

(57) ABSTRACT

Defects on a substrate comprising electronic components can be classified with a computational defect analysis system that may be implemented in multiple stages. For example, a first stage classification engine may process metrology data to produce an initial classification of defects. A second stage classification engine may use the initial classification, along with manufacturing information and/or prior defect knowledge to output probabilities that the defects are caused by one or more potential sources.

40 Claims, 8 Drawing Sheets

(56) References Cited

U.S. PATENT DOCUMENTS

| | | | |
|---|---|---|---|
| 10,887,580 B2* | 1/2021 | Kolchin | G01N 21/9505 |
| 2007/0230770 A1* | 10/2007 | Kulkarni | H01L 21/67005 |
| | | | 382/149 |
| 2007/0288219 A1* | 12/2007 | Zafar | G06T 7/0008 |
| | | | 703/14 |
| 2013/0174102 A1* | 7/2013 | Leu | G05B 19/41875 |
| | | | 716/52 |
| 2014/0226893 A1* | 8/2014 | Lo | G06T 7/001 |
| | | | 382/149 |
| 2015/0124247 A1* | 5/2015 | Park | G01B 11/0675 |
| | | | 356/237.5 |
| 2017/0040142 A1* | 2/2017 | Kumar Roy | H01L 22/00 |
| 2017/0193400 A1* | 7/2017 | Bhaskar | G06N 3/0472 |
| 2017/0337673 A1* | 11/2017 | Tseng | G06T 7/74 |
| 2017/0364798 A1 | 12/2017 | Karlinsky et al. | |
| 2018/0060702 A1 | 3/2018 | Ma et al. | |
| 2018/0114732 A1* | 4/2018 | Bell | G01N 21/91 |
| 2019/0005357 A1 | 1/2019 | Bhaviripudi et al. | |

FOREIGN PATENT DOCUMENTS

| | | | | |
|---|---|---|---|---|
| WO | WO 2005114095 A2 * | 12/2005 | | G01B 9/02042 |
| WO | WO 2006019919 A2 * | 2/2006 | | G03F 1/72 |
| WO | WO 2008121955 A2 * | 10/2008 | | H01L 22/34 |
| WO | WO 2014210359 A1 * | 12/2014 | | G01N 21/9501 |
| WO | WO 2017117568 A1 * | 7/2017 | | G03F 7/705 |

OTHER PUBLICATIONS

Lam Research, "CNNs can use image and spectral data to classify semiconductor defects with an industrially pragmatic accuracy" *Poster, Data Science Institute*, Aug. 8, 2018.

Lam Research, "CNNs can use image and spectral data to classify semiconductor defects with an industrially pragmatic accuracy" Poster, ChemX Conference, Oct. 6, 2018.

Li, Fei Fei, "How we're teaching computers to understand pictures" *TED Talk* https://www.ted.com/talks/fei_fei_li_how_we_re_teaching_computers_to_understand_pictures/transcript?language=en, Mar. 2015.

Krizhevsky, et al., "ImageNet Classification with Deep Convolutional Neural Networks" *NIPS'12 Proceedings of the 25th International Conference on Neural Information Processing Systems*, 1:1097-1105, Dec. 2012.

\* cited by examiner

DEFECT CLASSIFICATION AND SOURCE ANALYSIS FOR SEMICONDUCTOR EQUIPMENT

BACKGROUND

Particles and metal contamination on process wafers are a leading cause of product failure. Driven by ever smaller technology nodes, semiconductor device fabrication systems constantly advance. New process systems require new hardware components, increasingly complex assemblies, new manufacturing methods, and a close control on cleaning and handling techniques. The introduction of new parts can be a major source of particles on wafers. In addition, changes in existing process conditions can result in particle generation. Particles introduce device defects, which decrease yield and require analysis and resources that might be better used elsewhere.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Disclosed herein are methods and systems of defect classification using machine learning, deep learning, and/or other computational techniques for analyzing defect composition, morphology, wafer pattern maps, etc. and, optionally, combining the resulting analysis with prior knowledge of defect distribution at the chamber and/or fleet level as well as other information such as component manufacturing data, part composition data, material and manufacturing information, and other tool or platform level data. By combining the different inputs and analyzing the prior distributions, a refined, accurate posterior distribution can be predicted. The analysis may be conducted in multiple levels or stages. After each analysis level, the defect classification accuracy can be significantly increased.

In one aspect of the embodiments herein, a defect analysis computational system is provided, which system may be characterized by the following features: (a) one or more processors; and (b) program instructions for executing on the one or more processors, the program instructions including: one or more first stage defect classification engines configured to: receive metrology data acquired for defects on a substrate comprising electronic devices or partially fabricated electronic devices, and produce a first stage defect classification from the metrology data; and a second stage defect classification engine configured to: receive the first stage defect classification produced by the one or more first stage defect classification engines, receive manufacturing information, determine, using the first stage defect classification and the manufacturing information, one or more sources of the defects on the substrate, and output a likelihood of the defects being caused by a first source associated with the manufacturing equipment and/or fabrication process. In certain embodiments, the metrology data includes an image, composition data, and/or a wafer map. In certain embodiments, the manufacturing information includes data about (i) manufacturing equipment that conducts a fabrication process on the substrate and produces the defects on the substrate, (ii) the fabrication process, (iii) one or more materials on the substrate, and/or (iv) prior defect classification for the manufacturing equipment, one or more materials on the substrate, and/or fabrication process.

In various implementations, the metrology data includes the image, composition data, and/or the wafer map. In some such cases the metrology data also includes metadata pertaining to an inspection tool used in obtaining the metrology data.

In certain embodiments, the first stage defect classification includes a morphology, composition, or wafer map classification for the defects on the substrate. In some cases the first stage defect classification engine includes one or more neural networks.

Examples of the manufacturing equipment include a dry etch reactor, a chemical vapor deposition reactor, an atomic layer deposition reactor, a physical vapor deposition reactor, or an electroplating reactor.

In various embodiments, the second stage defect classification engine is additionally configured to further classify the defects on the substrate and/or provide suggested corrective actions to reduce generation of defects on the substrate and/or reduce occurrences of defects on substrates processed in the future. In further implementations, the second stage defect classification engine is configured to use Bayesian analysis to determine the one or more sources of defects on the substrate.

In some embodiments, the metrology data was obtained in situ during the fabrication process. In certain embodiments, the first stage defect classification engines are configured to receive sensor data including environmental conditions of the fabrication process, changes in the mass of the substrate during the fabrication process, mechanical forces experienced during the fabrication process, or combinations thereof, and the second stage defect classification engine determines the one or more sources of defects on the substrate using sensor data.

In another aspect of the embodiments herein, a computational method of analyzing defects is provided, the method including: receiving metrology data acquired for defects on a substrate including electronic devices or partially fabricated electronic devices, wherein the metrology data includes an image, composition data, and/or a wafer map; producing a first stage defect classification from the metrology data; receiving manufacturing information including data about (i) manufacturing equipment that conducts a fabrication process on the substrate and produces the defects on the substrate, (ii) the fabrication process, (iii) one or more materials on the substrate, and/or (iv) prior defect classification for the manufacturing equipment and/or fabrication process, determining, using the first stage defect classification and the manufacturing information, one or more likely sources of the defects on the substrate, and outputting a likelihood of the defects being caused by a first source associated with the manufacturing equipment, one or more materials on the substrate, and/or fabrication process.

In various implementations, the metrology data would include the image, composition data, and/or the wafer map. In some such cases the metrology data also includes metadata pertaining to an inspection tool used in obtaining the metrology data.

In certain embodiments, the first stage defect classification includes a morphology, composition, or wafer map classification for the defects on the substrate. In some cases one or more neural networks produce the first stage defect classification from the metrology data.

In some embodiments, the manufacturing equipment is a dry etch reactor, a chemical vapor deposition reactor, an atomic layer deposition reactor, a physical vapor deposition reactor, or an electroplating reactor.

In various embodiments, the method further includes, using the first stage defect classification and the manufacturing information, further classifying the defect on the substrate and/or providing suggested corrective actions to reduce generation of defects on the substrate and/or reduce occurrences of defects on substrates processed in the future.

In various implementations, determining one or more likely sources of the defects on the substrate includes performing a Bayesian analysis.

In certain embodiments, the metrology data was obtained in situ during the fabrication process. In some embodiments, the method further includes receiving sensor data including environmental conditions of the fabrication process, changes in the mass of the substrate during the fabrication process, mechanical forces experienced during the fabrication process, or combinations thereof, and determining the one or more likely sources of the defects on the substrate includes using the sensor data.

In another aspect of the embodiments herein, a computer program product for analyzing defects is provided, the product including a computer readable medium on which is provided computer executable instructions for: receiving metrology data acquired for defects on a substrate including electronic devices or partially fabricated electronic devices, wherein the metrology data includes an image, composition data, and/or a wafer map; producing a first stage defect classification from the metrology data; receiving manufacturing information including data about (i) manufacturing equipment that conducts a fabrication process on the substrate and produces the defects on the substrate, (ii) the fabrication process, (iii) one or more materials on the substrate, and/or (iv) prior defect classification for the manufacturing equipment and/or fabrication process, determining, using the first stage defect classification and the manufacturing information, one or more likely sources of the defects on the substrate, and outputting a likelihood of the defects being caused by a first source associated with the manufacturing equipment, one or more materials on the substrate, and/or fabrication process.

In various implementations, the metrology data would include the image, composition data, and/or the wafer map. In some such cases the metrology data also includes metadata pertaining to an inspection tool used in obtaining the metrology data.

In certain embodiments, the first stage defect classification includes a morphology, composition, or wafer map classification for the defects on the substrate. In some cases the instructions for producing the first stage defect classification from the metrology data includes instructions for processing the metrology data on one or more neural networks.

In some embodiments, the manufacturing equipment is a dry etch reactor, a chemical vapor deposition reactor, an atomic layer deposition reactor, a physical vapor deposition reactor, or an electroplating reactor.

In various embodiments, the computer executable instructions for determining the one or more likely sources of the defects on the substrate includes computer executable instructions for further classifying, beyond the first stage defect classification, the defects on the substrate. In some implementations the computer executable instructions provide suggested corrective actions to reduce generation of defects on the substrate and/or reduce occurrences of defects on substrates processed in the future.

In certain embodiments the one or more likely sources of the defects on the substrate comprise computer executable instructions for conducting a Bayesian analysis.

In some embodiments the metrology data was obtained in situ during the fabrication process. In some implementations the computer executable instructions for producing the first stage defect classification include computer executable instructions for receiving sensor data of environmental conditions of the fabrication process, changes in the mass of the substrate during the fabrication process, mechanical forces experienced during the fabrication process, or combinations thereof, and computer executable instructions for determining the one or more likely sources of the defects on the substrate include instructions for using the sensor data.

In various embodiments the computer executable instructions include further include instructions for using the likelihood of the defects being caused by a first source associated with the manufacturing equipment and/or fabrication process to generate a digital twin of the manufacturing equipment and/or fabrication process.

These and other features of the disclosed embodiments will be described in detail below with reference to the associated drawings.

DETAILED DESCRIPTION

Terminology

Figure 1A:
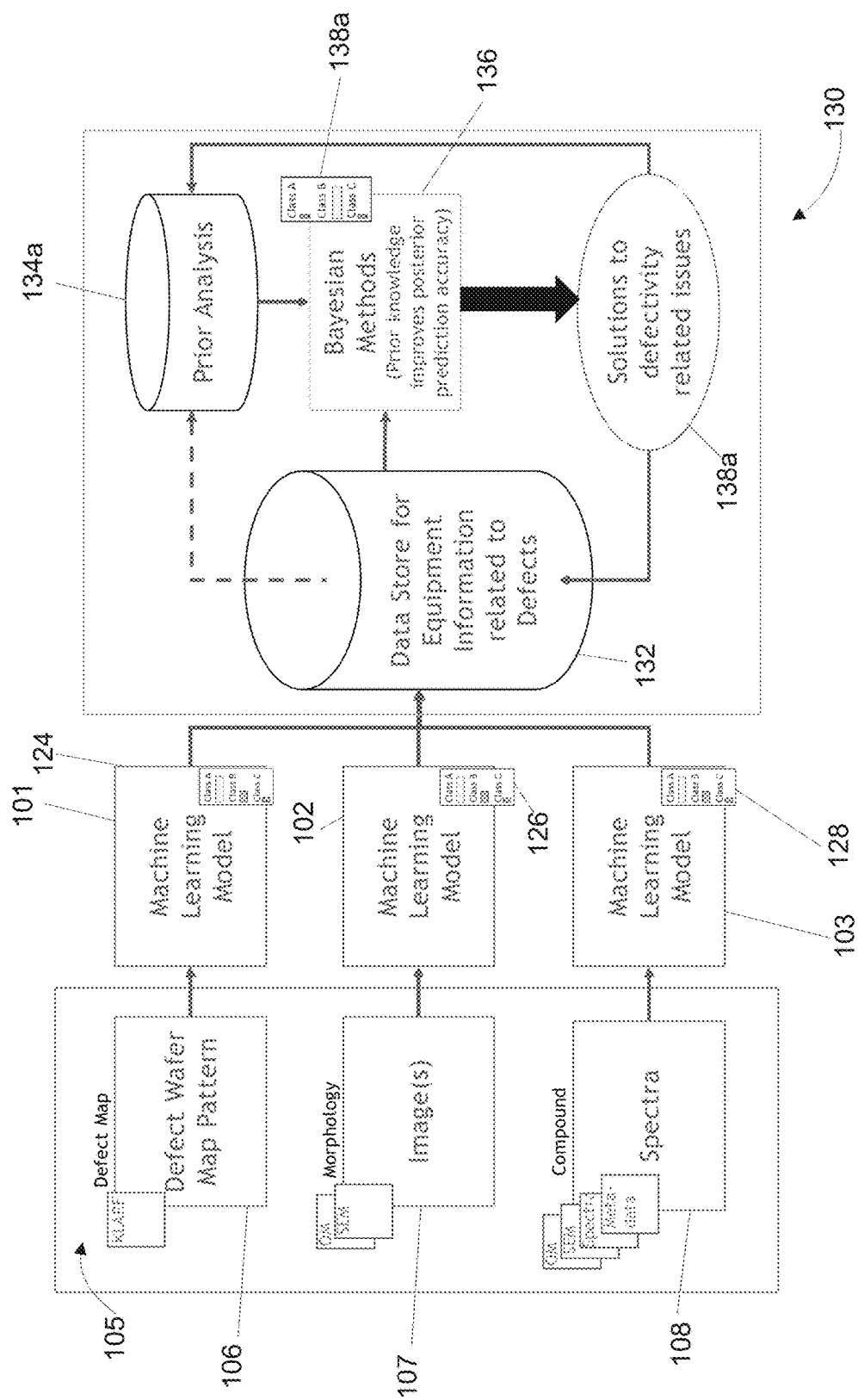
FIGS. 1A and 1B present example architectures of a defect analysis system.

The following terms are used throughout the instant specification:

The terms "semiconductor wafer," "wafer," "substrate," "wafer substrate" and "partially fabricated integrated circuit" may be used interchangeably. Those of ordinary skill in the art understand that the term "partially fabricated integrated circuit" can refer to a semiconductor wafer during any of many stages of integrated circuit fabrication thereon. A wafer or substrate used in the semiconductor device industry typically has a diameter of 200 mm, or 300 mm, or 450 mm. This detailed description assumes the embodiments are implemented on a wafer. However, the disclosure is not so limited. The work piece may be of various shapes, sizes, and materials. Besides semiconductor wafers, other work pieces that may take advantage of the disclosed embodiments include various articles such as printed circuit boards, magnetic recording media, magnetic recording sensors, mirrors, optical elements, micro-mechanical devices and the like.

A "semiconductor device fabrication operation" as used herein is an operation performed during fabrication of semiconductor devices. Typically, the overall fabrication process includes multiple semiconductor device fabrication operations, each performed in its own semiconductor fabrication tool such as a plasma reactor, an electroplating cell, a chemical mechanical planarization tool, a wet etch tool, and the like. Categories of semiconductor device fabrication operations include subtractive processes, such as etch processes and planarization processes, and material additive processes, such as deposition processes (e.g., physical vapor deposition, chemical vapor deposition, atomic layer deposition, electrochemical deposition, electroless deposition). In the context of etch processes, a substrate etch process includes processes that etch a mask layer or, more generally, processes that etch any layer of material previously deposited on and/or otherwise residing on a substrate surface. Such etch process may etch a stack of layers in the substrate.

"Manufacturing equipment" or "fabrication tool" refers to equipment in which a manufacturing process takes place that may produce defects in a semiconductor substrate or other workpiece. Manufacturing equipment often has a processing chamber in which the workpiece resides during processing. Typically, when in use, manufacturing equipment perform one or more semiconductor device fabrication operations. Examples of manufacturing equipment for semiconductor device fabrication include deposition reactors such as electroplating cells, physical vapor deposition reactors, chemical vapor deposition reactors, and atomic layer deposition reactors, and subtractive process reactors such as dry etch reactors (e.g., chemical and/or physical etch reactors), wet etch reactors, and ashers.

"Defects" as described herein are deviations from the proper functioning of a process, layer or product. The defects may be random or systematic. Process defects are deviations from the expected process that can cause malfunctioning of a fabricated device or product. An example of a process defect is scumming, where residue from a photoresist remains on the wafer after stripping. Another example is unwanted bridging, possibly resulting in a short circuit, between elements in a device. Particle defects may be classified by properties such as composition, shape (or morphology), size, and location on a wafer. Defects on semiconductor substrates may originate from one or more sources, often in a substrate processing chamber. Processing chamber components such as showerheads, chamber walls, seals, and windows may shed materials in the form of particles, which may produce wafer defects. Additionally, some fabrication processes such as etching processes may result in redeposition or residue left on the substrate, thereby causing defects. Furthermore, defects may result from movement of materials on the substrate, such as reflow of materials during a thermal process, or unintended deposition of particles on the bottom or sides of a wafer that later move and are re-deposited on the top of the wafer.

A "metrology data" as used herein refers to data produced, at least in part, by measuring features of a processed substrate or reaction chamber in which the substrate is processed. The measurement may be made while or after performing the semiconductor device fabrication operation in a reaction chamber. In certain embodiments, metrology data is produced by a metrology system performing microscopy (e.g., scanning electron microscopy (SEM), transmission electron microscopy (TEM), scanning transmission electron microscopy (STEM), reflection electron microscopy (REM), atomic force microscopy (AFM)) or optical metrology on the etched substrate. When using optical metrology, a metrology system may obtain information about defect location, shape, and/or size by calculating them from measured optical metrology signals. In certain embodiments, the metrology data is produced by performing reflectometry, dome scatterometry, angle-resolved scatterometry, small-angle X-ray scatterometry and/or ellipsometry on a processed substrate. In some embodiments, the metrology data includes spectroscopy data from, e.g., energy dispersive X-ray spectroscopy (EDX). When using spectroscopy, a metrology system may obtain information about defect composition. Other examples of metrology data include sensor data such as temperature, environmental conditions within the chamber, change in the mass of the substrate or reactor components, mechanical forces, and the like.

In some embodiments, the metrology data includes "metadata" pertaining to a metrology system or conditions used in obtaining the metrology data. Metadata may be viewed as a set of labels that describe and/or characterizes the data. A non-exclusive list of metadata attributes includes:

Process Tools design and operation information such as platform information, robot arm design, tool material details, part information, process recipe information, etc.

Image capture details such as contrast, magnification, blur, noise, brightness, etc.

Spectra generation details such as x-ray landing energy, wavelength, exposure/sampling time, chemical spectra, detector type, etc.

Metrology tool details such as defect size, location, class identification, acquisition time, rotation speed, laser wavelength, edge exclusion, bright field, dark field, oblique, normal incidence, recipe info etc.

Sensor data from the fabrication process (which may be in-situ or ex-situ): spectral range of captured data, energy, power, process end point details, detection frequency, temperature, other environment conditions, etc.)

Machine learning model—A machine learning model is a trained computational model that takes metrology data extracted from defects on a substrate and classifies the defects, for example, by composition, shape, size, location, etc. Examples of machine learning models include random forests models, including deep random forests, neural networks, including recurrent neural networks and convolutional neural networks, restricted Boltzmann machines, recurrent tensor networks, and gradient boosted trees. The term "classifier" (or classification model) is sometimes used to describe all forms of classification model including deep learning models (e.g., neural networks having many layers) as well as random forests models.

In the art, some machine learning models are characterized as "deep learning" models. Unless otherwise specified, any reference to "machine learning" herein includes deep learning embodiments. A deep learning model may be implemented in various forms such as by a neural network (e.g., a convolutional neural network), etc. In general, though not necessarily, it includes multiple layers. Each such layer includes multiple processing nodes, and the layers process in sequence, with nodes of layers closer to the model input layer processing before nodes of layers closer to the model output. In various embodiments, one layers feeds to the next, etc. The output layer may include nodes that represent various defect classifications (e.g., location on a wafer such as edge, center, or random, composition including, e.g., tungsten, aluminum oxide, and copper oxide, and morphology such as cluster, flake, and sphere, etc.). In some implementations, a deep learning model is a model that takes data with very little preprocessing and outputs a classification of the defect.

In various embodiments, a deep learning model has significant depth and can classify a large or heterogeneous array of defects. In some embodiments, the model has more than two (or more than three or more than four or more than five) layers of processing nodes that receive values from preceding layers (or as direct inputs) and that output values to succeeding layers (or the final output). Interior nodes are often "hidden" in the sense that their input and output values are not visible outside the model. In various embodiments, the operation of the hidden nodes is not monitored or recorded during operation.

The nodes and connections of a deep learning model can be trained and retrained without redesigning their number, arrangement, interface with image inputs, etc. and yet classify a large heterogeneous range of cellular artifacts.

As indicated, in various implementations, the node layers may collectively form a neural network, although many deep learning models have other structures and formats. Some embodiments of deep learning models do not have a layered structure, in which case the above characterization of "deep" as having many layers is not relevant.

"Bayesian analysis" refers to a statistical paradigm that evaluates a prior probability using available evidence to determine a posterior probability. The prior probability is a probability distribution that reflects current knowledge or subjective choices about one or more parameters to be examined. As an example, the prior probability may include a distribution of defect counts or types of defects based on different categories for a given tool. The prior probability may also include a coefficient of variance or reporting limit of stored measurements. Evidence is new data that is collected or sampled which affects the probability distribution of the prior probability. Using Bayes theorem or a variation thereof, which are well known to those skilled in the art, the prior probability and evidence are combined to produce an updated probability distribution called the posterior probability. In some embodiments, Bayesian analysis can be repeated multiple times, using the posterior probability as a new prior probability with new evidence.

A "digital twin" is a mathematical model of a chamber or other component or tool that is used as a reference for comparison against usage history, component/tool specifications, and/or metrology data collected from a variety of networked sensors collecting data in the component or tool. A digital twin represents the functioning of the tool, component, and/or fabrication processes. In some embodiments a digital twin is built from metrology data. Sensors are placed throughout a chamber to constantly collect data during a fabrication process. The collected data is then organized into a digital representation of the process chamber at any given point during a fabrication process. In some embodiments a digital twin is modelled using metrology data. In some embodiments, a digital twin is constructed using historical information and/or specifications about a tool, component, or process. Examples of such information include expected or observed lifetimes for consumable parts, maintenance schedules, and the like.

A digital twin can act as a reference system for the tool or component it is modeling. During operation of a chamber, the data collected from various sensors in the chamber can be compared against the information contained in the digital twin. Variations between the collected data and the data of the digital twin can indicate the likely occurrence of unacceptable defectivity in the fabrication process or the substrate.

Over time, using information from actual tools or processes in operation, a digital twin may be refined. For example, as fabrication processes proceed and defect analysis continues, the digital twin may update its data to reflect appropriate ranges of values collected by the various sensors in the chamber. Over time, a digital twin could learn which sensor value deviations can be classified as defects.

A digital twin can be implemented as a machine learning model (e.g., a deep learning model). Typically, however, a digital twin is implemented as a computationally simple statistical or classification model of a tool, component, or process. And even if it is implemented as a neural network or other sophisticated machine learning algorithm, it can be made relatively simple (e.g., it requires relatively few layers in neural network). Of course, such a relatively simple digital twin may be generated using more computationally intensive defect classification algorithms such as the defect classification and source identification algorithms described herein. In various embodiments the sensor data is provided to both a digital twin and a defect classification model of a type described herein. The digital twin may use such data to quickly determine, sometimes in real time during a fabrication process, whether maintenance or some remedial action is needed. A defect classification algorithm may use such data to determine whether defects are actually present, determine a likely source of such defects, and/or suggest a remedial action. For example, a digital twin may identify defects in the fabrication process before the defects are irreversible, allowing adjustments to the fabrication process to remediate the defects on the examined substrate, thus increasing the substrate yield.

A "defect analysis system" is a computational system that receives metrology data as an input and provides a defect classification as an output. The metrology data contains information about one or more defects on a substrate. A defect analysis system may also receive, as an input, information about the particular manufacturing equipment and/or fabrication process used to perform an operation that produces defects. In addition to providing a defect classification, a defect analysis system may provide a source or root cause of defects as an output. And, in some embodiments, a defect analysis system can also provide a suggested remedial action to reduce or prevent some types of defects from occurring in future operation of a piece of manufacturing equipment. The suggested remedial action may include a modification to process conditions employed in manufacturing equipment or modification to the equipment itself.

In certain embodiments, a defect analysis system includes one or more logic engines or modules that handle different functions of the defect analysis system. For example, one engine receives metrology data and provides an initial classification of defects, while a second engine receives the initial classification and information about the manufacturing equipment and/or a process conducted on the equipment that produces the defect. The second engine may provide a refined defect classification, a root cause identification, and/or a suggested remedial action. The engines may be implemented as software or other computer instructions.

A "first stage defect classification engine" takes as inputs metrology data such as images of defects, spectra of defects (and their surroundings), and/or wafer maps. A first stage defect classification engine may be implemented by any of various classification algorithms, which may be machine learning models. Examples include convolutional neural networks, recurrent neural networks, recurrent convolutional neural networks, generative adversarial networks, autoencoders, and the like. A first stage classification engine outputs defect classification such as defect composition, shape, size, and/or distribution on a wafer.

A defect analysis system may have one or more first stage classification engines, each configured to act on inputs from one or more metrology sources. For example, one first stage defect classification engine may act on wafer maps, another may act on spectral data, and a third may act on images. In some embodiments, a single first stage defect classification engine acts on two or more different types of metrology data (e.g., spectral and image data) taken from locations of the defects. Each of the one or more first stage defect classification engines may have one or more distinct classification algorithms.

A "second stage defect classification engine" takes as input, and operates on, defect classifications from at least one first stage classification engine. Such inputs may include defect composition, shape, size, and/or distribution on a wafer. The second stage engine outputs a refined defect classification, a root cause determination, and/or a suggested remedial action. In some implementations, a second stage defect classification engine additionally receives information about the manufacturing tool and/or process that produces defects under consideration.

A second stage defect classification engine may be implemented by any of various classification algorithms, which may be machine learning models. In some cases, the second stage defect classification engine is configured to perform a Bayesian analysis. In some cases, the second stage defect classification engine is configured to execute a decision tree.

A "defect source" or "root cause" of a defect is a process operation and/or equipment component that produces particles or other conditions that lead to defects on a semiconductor substrate. Examples of equipment components that may be defect sources include showerheads, rings, dielectric windows, process chamber walls, gas lines, elastomer coatings, mechanical wear, wafer transport systems, and fluid delivery systems. In some cases, all process parts exposed to fabrication chemistry are potential defect sources. Examples of process parameters include deposition precursors, chemical etchants, plasma conditions (e.g., plasma power, plasma frequency, substrate bias, ion direction, and the like), gas flow rates and pressure, pedestal temperature, process timing, chamber conditioning, valve sequences, or mass of the substrate. Other conditions could include one or more materials on the substrate that cause the defect. The resulting defects of any these sources may be particles, scumming, bridging, pinholes, and the like. The root cause or source may also specify a particular condition associated with an equipment component that produced the defects. Examples include deposits on a chamber wall, showerhead, or pedestal, a crack in the component, wear and tear, etc.

The term "manufacturing information" refers to information regarding a fabrication tool responsible for producing defects. Manufacturing information may include information about the history of the tool (including information about defects previously produced, processes previously performed on the tool, and histories of other similar tools), one or more materials deposited on or etched from substrates in the tool, and the like. Manufacturing information may also include information about other tools that share certain components or perform similar operations.

Overview

Due to their direct impact on process quality and wafer yield, defects are a priority for semiconductor device manufacturers and fabrication equipment vendors. Defect classification, identifying sources of the defects, and identifying corrective actions to eliminate the sources of defects require on-going investment of time and resources, and this is not only during process development but also during process optimization and hardware upgrades.

During defect analysis, engineers are required to solve a range of problems, including identifying the pattern of the defects on wafers and classifying the defects based on composition, size, shape, etc. Ultimately, to resolve the defect issue fully, engineers must identify the source of the defects and implement corrective actions.

Conventionally, classifying defects based on chemical spectra and/or morphology and ascribing them to known sources on the system has been done manually. Occasionally defects can also be identified based on wafer map locations for particle distribution and/or based on their size distribution at given locations on tools that are very well understood. However, this method is also primarily manual.

Even with some level of automation, engineers routinely spend much time manually classifying defects. This is followed by root cause analysis such as fish bone analysis and/or other methods. Ultimately, once a hypothesis on a root cause is devised, an engineering team must not only perform corrective actions, but then repeat to test the validity of the hypothesis. This is a very manual and labor intensive effort. Some estimates suggest between 23%-34% of an engineer's effort per year is spent on non-value-added classification and reporting tasks.

Disclosed methods and systems may provide accurate and rapid defect classification, root cause analysis (to identify sources of defects), and/or recommended corrective actions. Methods and systems disclosed herein may provide an automated defect analysis methodology. In certain embodiments, an adaptive classification technique such as on-going machine learning is employed and may be applied across multiple tools, multiple system upgrades, etc. In certain embodiments, machine learning (e.g., deep learning) techniques such as neural networks (e.g., convolutional neural networks, recurrent neural networks, recurrent convolutional neural networks, generative adversarial neural networks, autoencoders, etc.) are combined with use of prior knowledge of tool data such as manufacturing equipment information, component level data, platform information, recipe information, chamber configuration, etc. Disclosed methods may also employ subject matter expertise in the form of a mathematical likelihood (using Bayesian and/or other methods).

Computational Defect Analysis System

Various aspects of the disclosure concern computational tools for classifying defects and, in some cases, identifying a source of the defects in a semiconductor fabrication reaction chamber or process. And, in some cases even beyond this, the computational tool may suggest a corrective action for addressing the source of the problem. In certain embodiments, the computational tool is pipelined, e.g., in the sense that a first phase defect classification engine operates on raw or relatively unprocessed data (e.g., data from one or more metrology tools) and provides an output that is fed to a second phase defect classification engine that provides an overall defect classification and/or defect source identification. In some cases the second phase defect classification engine provides a recommended procedure for reducing defects. The general pipeline may include input from one or more (e.g. three or more) sources and multiple branches feeding into a central classification engine such as a second stage defect classification engine. The sources of input may include metrology tool data, fabrication tool and/or process information, manufacturing information, and/or prior information about classification, source, and/or solution.

FIG. 1A presents a schematic illustration of an example defect analysis system with multiple first stage defect classification engines 101, 102, and 103 and a second stage defect classification engine 130. Metrology data 105 is fed into each first stage defect classification engine to produce first stage defect classifications 124, 126, and 128, respectively. For example, a wafer map 106 is fed into first stage defect classification engine 101, which produces a first stage defect classification 124. Morphology data 107 such as images of defects is fed into first stage defect classification engine 102, which produces a first stage defect classification 126. Composition data 108 is fed into first stage defect classification engine 103, which produces a first stage defect classification 128. Note, however, that in some embodiments more or less than three first stage defect classification engines are used to provide first stage defect classifications. Metrology data 105 may be processed by a single first stage defect classification engine or multiple first stage defect classification engines. Metrology data 105 may also be separated into distinct categories of data and fed exclusively into one first stage defect classification engine (as shown here), or fed into multiple first stage defect classification engines.

In the depicted embodiment, metrology data 105 may include wafer map 106, morphology data 107, and/or composition data 108. Wafer maps are representations of substrates, obtained either during or after fabrication processing, by metrology tools that detect abnormalities on the substrate. Wafer maps, such as Klarf maps, visualize defects and defect density and can be used to classify defects based on patterns such as lines, curves, or clusters and locations such as the edge, center, or a relative position on the substrate. Wafer maps may display a pattern that corresponds with defects produced by a particular fabrication process or manufacturing equipment, such as lines that match with the shower head, or a ring at the edge that matches with a ring of the manufacturing equipment. In this way the wafer map can be used to determine the source of the defect based on matching the pattern of the defect with potential sources of defects. The wafer map may also implicitly suggest information on remedial action, such as replacing components that are flaking particles onto the wafer. Of course, the connection between a wafer map and particular sources of defects may be much more complex and not easily detected and/or understood by even a very talented engineer.

Figures 5, 6:
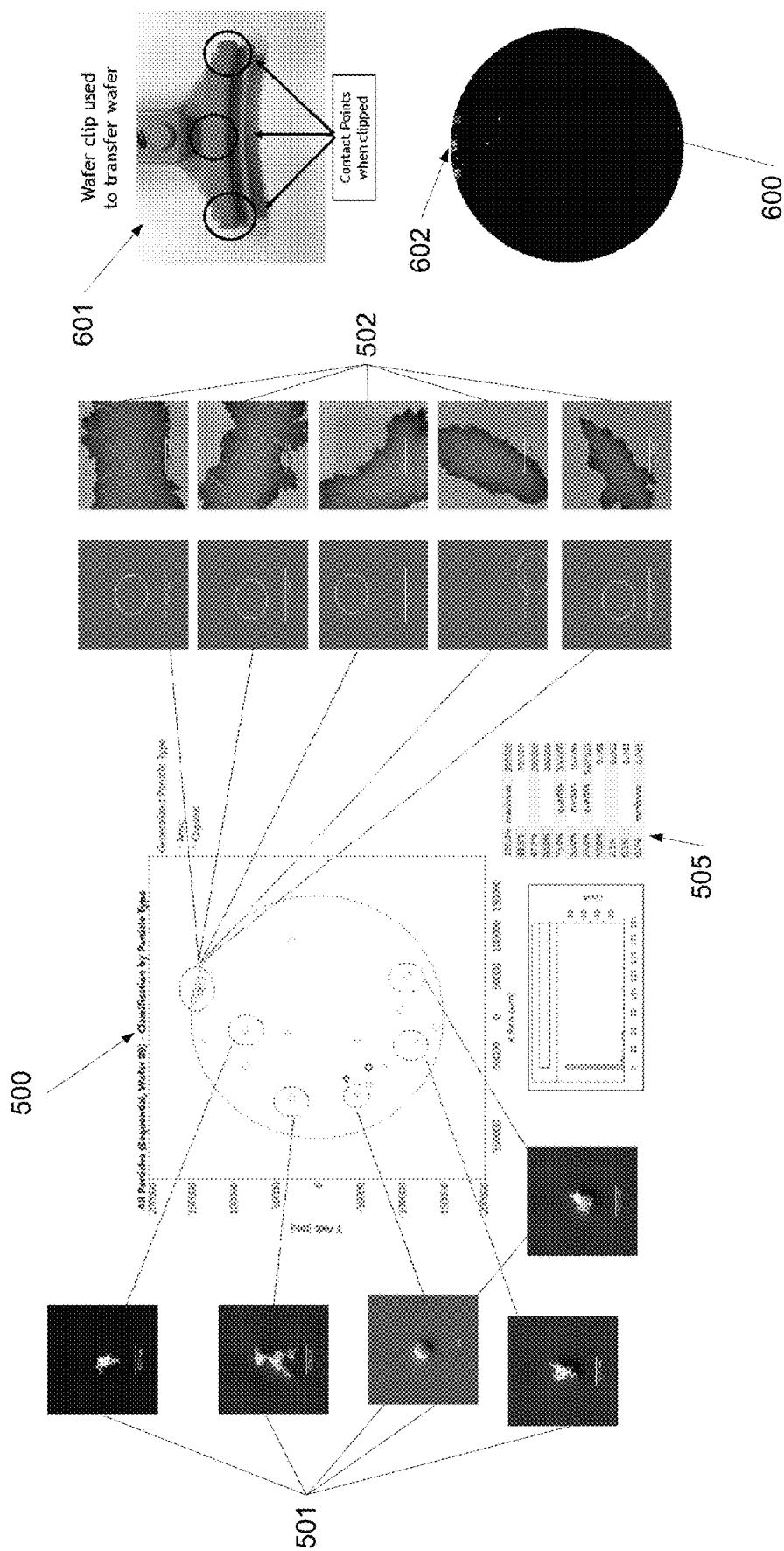
FIG. 5 presents examples of defects and defect sources.
FIG. 6 presents an example of defects caused by a wafer clip represented on a wafer map.

FIG. 5 and FIG. 6 show two example wafer maps, a wafer map 500 and a wafer map 600. In analyzing wafer map 500, a first stage defect classification engine may produce classifications for two potential sources of the defects, one for the large particle defects 502, and another for the small particle defects 501. In analyzing wafer map 600, a first stage defect classification engine may produce a classification based on the location of the defects near an edge, and may additionally produce a classification based on the source of the defect. For wafer map 600, a wafer clip 601 may be presumed to cause some of the defects. A first stage defect classification may classify the defect as being at an edge, while a second stage defect classification engine may produce a likely source of the defect as the contact points of the wafer clip 601. Again, these are simple examples to illustrate information that a defect analysis system may use and relations between data and source that it might consider. It will be trained to handle much more complex situations and provide quantitative guidance.

Morphology data may include images of specific defects and can be used to classify the size and/or shape of defects. Images may be taken using electron microscopy, atomic force microscopy, or other imaging techniques. Defects that are larger or smaller than certain values may only result from specific sources. Defects of a specific shape or size may also correlate with a composition or microstructure, and thus also lead to source identification.

FIG. 5 shows morphology data for small particle defects 501 and for large particle defects 502. In an example embodiment, a first stage defect classification engine processes all ten images to produce one or more first stage defect classifications. In general, a first stage defect classification engine may process every image taken of a defect, which could be a single image or multiple images. There may also be multiple sources of the defects, in which case a first stage defect classification engine may produce a single classification for all defects, multiple classifications for all defects, and/or multiple classifications for different groupings of defects. A first stage defect classification may account for the size and/or shape of the defects.

Composition data may include spectral information that correlates with the composition of defects and the surrounding environment. Examples of techniques that produce spectral information include X-ray spectroscopy (e.g., EDS), Auger electron spectroscopy, wavelength-dispersive X-ray spectroscopy, and X-ray diffraction (XRD).

Metrology data may also include metadata about one or more of the metrology tools used to collect metrology data from the wafer. This may include the operational settings on a given tool or prior metrology data received by the tool. In some embodiments metrology data includes the specific metrology tool used to collect metrology data, its construction and design, manufacturer, and the conditions under which it has been operated while in service.

Returning to FIG. 1A, wafer map 106, morphology data 107, and composition data 108 are fed into first stage classification engines 101, 102, and 103, respectively, to produce first stage defect classifications 124, 126, and 128, respectively (e.g., outputs of machine learning models). In some embodiments, metrology data pertaining to morphology (e.g., images) and composition (e.g., spectra) are fed into a single first stage defect classification engine, and in other embodiments all metrology data is fed into a single first stage defect classification engine, and there is only one first stage defect classification. In machine learning embodiments, the options for first stage defect classifications (e.g., flake v. cluster or tungsten v. yttrium oxide) are defined by users who create training sets to train the first stage defect classification engines 101, 102, and 103.

In the embodiment depicted in FIG. 1A, first stage defect classification engines 101, 102, and 103 are machine learning models. Note, however, that in other embodiments first stage defect classification engines could be different classification algorithms such as classification trees. Machine learning models use raw data from metrology tools to classify defects on the wafer. In some embodiments a convolutional neural network is used to process image data from metrology tools, such as a wafer map or morphology data, while spectra data is processed by a different machine learning model using different algorithms. In other embodiments, multiple types of metrology data are processed by a single first stage defect classification engine. For example, morphology data and spectra data may be processed by the same first stage defect classification engine. In various embodiments the morphology data and spectra data are processed by a single machine learning model such as a convolutional neural network, with the morphology data going through one or more convolutional layers, and the spectra data provided to the first fully connected layer of the convolutional neural network. The output of the one or more convolutional layers is also provided to the first fully connected layer. In some embodiments, a machine learning model, such as any of the above models, is configured to produce one or more putative classifications for a defect or group of defects.

In the embodiment depicted in FIG. 1A, the first stage defect classifications 124, 126, and 128 are fed into a second stage defect classification engine 130 having a data store 132. The data store 132 may store manufacturing information about a fabrication tool or information about a semiconductor device fabrication operation. The data store 132 may also store information about prior defects, including classifications, root causes, and corrective actions that prevented future occurrences of similar defects. The data store 132 may also store information about similar tools using similar parts. The information in the data store 132 may also include information from process engineers and operators who have worked with defects and identified sources or root causes of defects and corrective actions that have or have not been effective in reducing or eliminating the defects.

In the depicted embodiment, the second stage defect classification engine 130 is configured to perform an analysis using information from the data store 132, including outputs from first stage defect classification engine(s), as well as a prior probability 134a. Data store 132 may contain information on the module (e.g. materials of construction, wear rates, etc.), platform information (e.g. materials of construction, robots, mechanical contact, load locks, etc.), recipe information, and manufacturing information. Prior probability 134a contains results from prior analyses, including defect count distributions, defect types for different categories, and categories of defects associated with various tools. The result of this analysis, which is an output of second stage classification engine 130, may be a more refined classification of the defects, sometimes referred to as a second stage defect classification 138a, and/or other information as discussed below. In some embodiments the analysis is done using Bayesian analysis, but in other embodiments a different statistical analysis is used to produce the second stage defect classification 138a. In some embodiments a classification tree is used. In some embodiments, a machine learning model is used.

Bayesian analysis requires a prior probability, which may be an initial probability distribution of classifying the defect(s), a source of the defect(s), and/or a remedial action to prevent occurrences of the defect(s). Available evidence is then used to evaluate the prior probability and determine a posterior probability that is the second stage defect classification, the source of the defect(s), and/or remedial actions. The first stage defect classifications are part of the evidence used to evaluate the prior probability. Stated another way, the first stage classification engine may provide results that are relevant for the defect under observation. The prior analysis is based on data from past results. The $i^{th}$ step results of first stage defect classification may be used as a $(i+1)^{th}$ step prior during the second stage analysis. Information in the data store may be used as part of creating the prior probability, fed into the analysis as evidence in evaluating the prior probability, or both. The prior probability also includes posterior probabilities from previous defect analyses.

The form of the second stage defect classification 138a may depend upon the form of the particular method or algorithm used to create it. In some cases, the second stage defect classification 138a includes multiple classifications, each with an associated probability or likelihood value ascribed thereto. In addition, the second stage defect classification 138a may include one or more sources or root causes of the defects and probability or likelihood values ascribed to each of them. Still further, the second stage defect classification 138a may include one or more corrective actions with an associated probability that the corrective action will be successful in reducing or removing the defects.

Corrective actions may include part replacement (e.g. corroded gas lines, filter failures, O-ring failure, other part failures, pump failures, wear and tear of parts, clogging of parts/orifice, etc.), part cleaning (e.g. poorly cleaned showerhead resulting in showerhead patterns, dirty view ports, dirty mixing bowl, gas line dusting/contaminated, ESC contamination, etc.), part redesign (e.g. mechanical scratches from robot arms and/or other contact points in the tool, aggressive plasma clean damaging pipe, PM door rubbing/contact, poor RF grounding, edge ring height etc.), chemistry residence check/corrections (e.g. gas phase condensation, insufficient chamber clean etc.), operator behavior (e.g. handling of wafers, incorrect process and/or metrology recipe, etc.), process tuning (e.g. peeling of coatings, insufficient chamber conditioning, insufficient undercoat, precoat and clean, in-film defects such as volcanos/pits, unstable plasma modes, etc.), or any combination thereof.

Figure 1B:
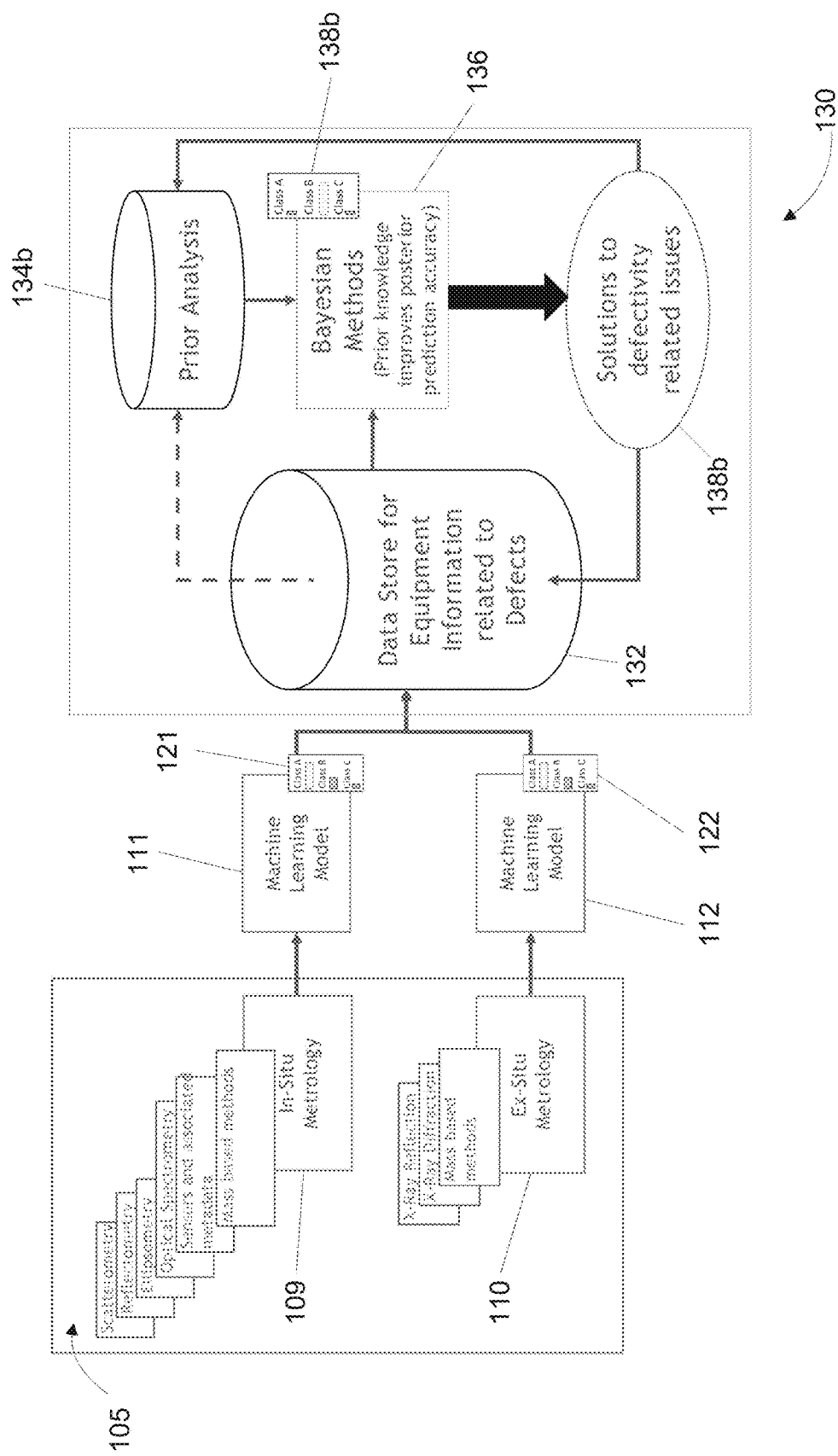

FIG. 1B presents another schematic illustration of an example defect analysis system where metrology data 105 is fed into two first stage defect classification engines 111 and 112 and the second stage defect classification engine 130. In this illustration, the first stage defect classification 111 operates on in situ metrology data 109 to output a first stage defect classification 121. In situ metrology data is collected within a chamber, and could be collected before, during, or after a fabrication process. In situ metrology data 109 includes, for example, data from scatterometry, reflectometry, ellipsometry, optical spectrometry, mass of the substrate, or other sensor data. In situ metrology data 109 may be used to classify defects during fabrication. In some embodiments, in situ metrology data may be used to suggest corrective actions that remedy defects on the substrate from which in situ metrology data is collected. By example, a bridging defect could be corrected by etching the substrate to remove the bridged material before proceeding with the next fabrication process. This allows for increased yield from a substrate by identifying and remedying defects in real time.

In some embodiments, the first stage defect classification engine 112 operates on ex situ metrology data 110. Ex situ metrology data is collected outside of the chamber, and typically after a fabrication process. Ex situ metrology data 110 is used by the first stage defect classification engine 112 to output a first stage defect classification 122.

In the embodiment depicted in FIG. 1B, the first stage defect classifications 121 and 122 are fed into the second stage defect classification engine 130. Similar to the embodiments of FIG. 1A, the second stage defect classification engine 130 performs an analysis using the data store 132, including outputs from the first stage defect classification engine(s), as well as a prior analysis 134b. The result of this analysis, which is an output of the second stage defect classification engine 130, may be a more refined classification of the defects, sometimes referred to as a second stage defect classification 138b.

To collect a wide range of data that may be used in the computational defect analysis, various sensors may be used beyond the defect classification sensors indicated above. Such additional sensors may be configured for in situ and/or ex situ data collection. As indicated, such sensors may include sensors for environmental conditions of the fabrication process (e.g., temperature, pressure, flow rate(s), plasma conditions, etc.), change in the mass of the substrate during the fabrication process, mechanical forces experienced during the fabrication process, and combinations thereof. Such data may be fed to the first stage and/or second stage defect classification engines.

In some embodiments, a digital twin is used to mimic some or all the behavior of the first stage defect classification engines 111 or 112 and/or the second stage defect classification engine. In some embodiments, such digital twin accepts some or all of the inputs used by the first and/or second stage defect classification engines. As indicated, the digital twin may be a mathematical model of the chamber, a component, and/or the substrate that can be used as a reference to compare collected metrology data against. In some implementations, the digital twin allows for faster classification of certain defects based on the collected metrology data and/or other sensor data.

In some embodiments the digital twin is created from a variety of networked sensors integrated with multiple chambers, implementing Industry 4.0. Similar sensors are used with a large number of chambers, tools, or platforms to collect data regarding similar processes being carried out at each chamber, tool or platform. The digital twin is then used to detect variances amongst a large number of chambers, tools, or platforms. The combination of networked sensors and equipment may then be used to analyze defects across chambers, tools, or platforms to determine root causes that are common to multiple pieces of equipment.

Figure 2:
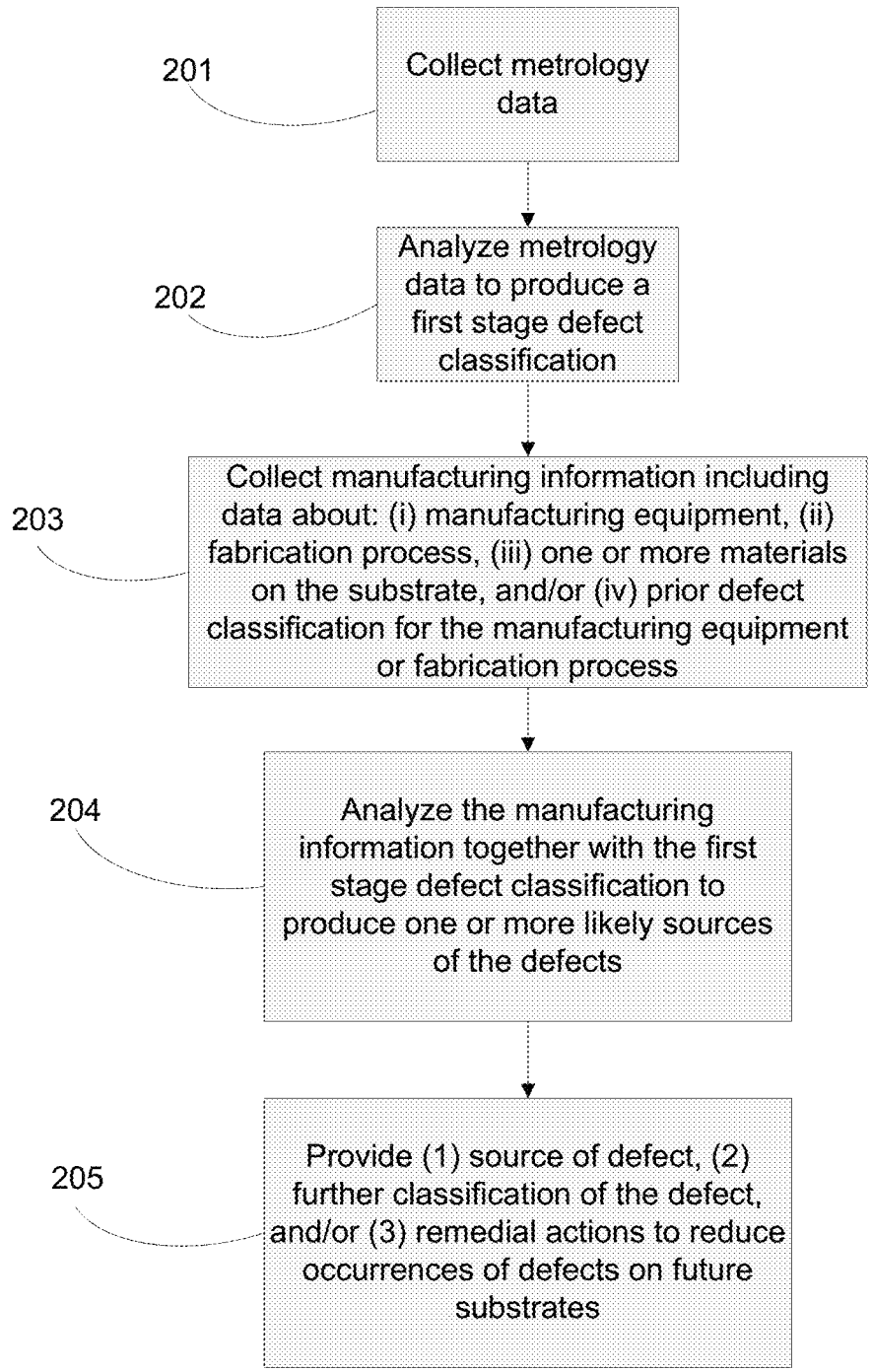
FIG. 2 presents a flow diagram of an operation of a processor for one example embodiment.

FIG. 2 is a process flow diagram showing operations performed in a method in accordance with certain disclosed embodiments. The disclosed operations may be performed on any suitable system, regardless of whether it is pipelined as illustrated in the system of FIG. 1. In an operation 201, metrology data is collected. As explained, metrology data may include a wafer map, morphology data that indicates the size and shape of a defect (or defects), composition data including a spectrum, and/or other data about the defect(s).

In an operation 202, the metrology data is analyzed to produce one or more first stage defect classifications. In some embodiments machine learning models are used to classify the defects into various classifications.

In an operation 203, manufacturing information is obtained or collected. Manufacturing information includes information about the manufacturing equipment, such as the materials present in the manufacturing equipment, the design of its components, and its configurations. Manufacturing information may also include information about the fabrication process, including process recipe information. Manufacturing information may also include information about the materials on the substrate, such as its composition, size, or shape. Manufacturing information may also include prior defect classification information based upon the manufacturing equipment, fabrication process, or materials on the substrate.

In an operation 204, the manufacturing information is analyzed along with the first stage defect classification from operation 202. This analysis can be done with a variety of statistical methods. In one embodiment, Bayesian analysis is used to produce one or more likely sources of the defect. In another embodiment, a machine learning model is used. In various embodiments a classification tree is used. In some embodiments a clustering algorithm is used. In some embodiments a dimension reduction technique such as principle component analysis (PCA) is used.

In an operation 205, one or more likely sources of the defect are provided. In some embodiments there may be a further classification of the defect or suggested remedial actions to reduce occurrences of defects on future substrates. Remedial actions may include changes to the manufacturing equipment or the fabrication process, cleaning or replacement of various components, or changes to the materials used in the process.

Figure 3:
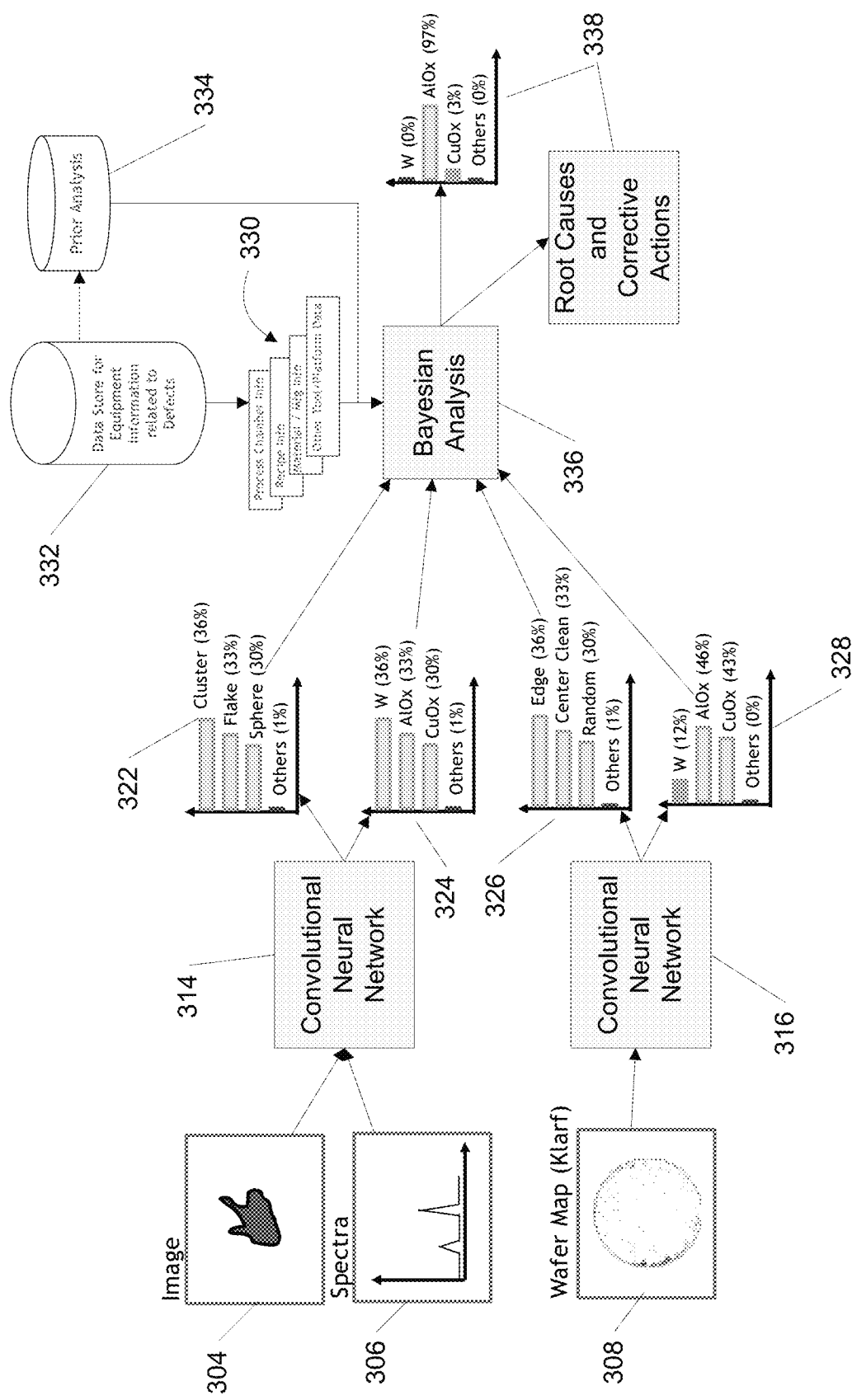
FIG. 3 presents a block diagram for one example embodiment.

FIG. 3 is a block diagram demonstrating an example process that identifies defects on the wafer as aluminum oxide. As shown, morphology data 304 and spectra data 306 are fed into a convolutional neural network 314, which produces first stage defect classifications 322 and 324. In some embodiments the morphology data is an image, which is processed through convolutional layers of the convolutional neural network. The output of the convolutions may then be fed into a fully connected layer along with the spectra data. The first stage defect classifications 322 and 324 may then include classifications about the composition of the defect, as well as classifying the size and shape of the defect.

In this example, wafer map data 308 is fed into a separate convolutional neural network 316 to produce first stage defect classifications 326 and 328. These classifications are distinct from classifications 322 and 324, even though first stage defect classification 324 and 328 may both suggest potential compositions of the defect. Note that neural network 316 has been trained to output not only a classification of the location/distribution of defects (classification 326) but also a likely classification of the defect composition (classification 328). While first stage defect classification 324 suggests a high probability the defects contain tungsten, first stage defect classification 328 suggests a relatively lower probability the defects contain tungsten, and instead suggests a high probability that the defects contain aluminum oxide.

A Bayesian analysis engine 336 is then used to analyze the first stage defect classifications along with information from a data store 332 and a prior analysis 334. In this example, Bayesian analysis engine 336 may be considered the sole or primary component of a second stage defect classification engine. As explained above, a data store such as data store 332 may include manufacturing information 330 such as information on the fabrication process, the recipe information, what materials have been deposited or removed by a process, and the historical data of specific tools.

A second stage defect classification 338 is the result of the Bayesian analysis. This is a refined defect classification in that it provides a classification that is more likely correct than any first stage defect classification. In this example, there is a very strong probability that aluminum oxide is a principal component of the defect, and a much lower probability that tungsten is a principal component. In some embodiments the second stage defect classification also outputs potential sources of the defects and/or possible remedial actions to prevent future occurrences of the defect.

Figure 4:
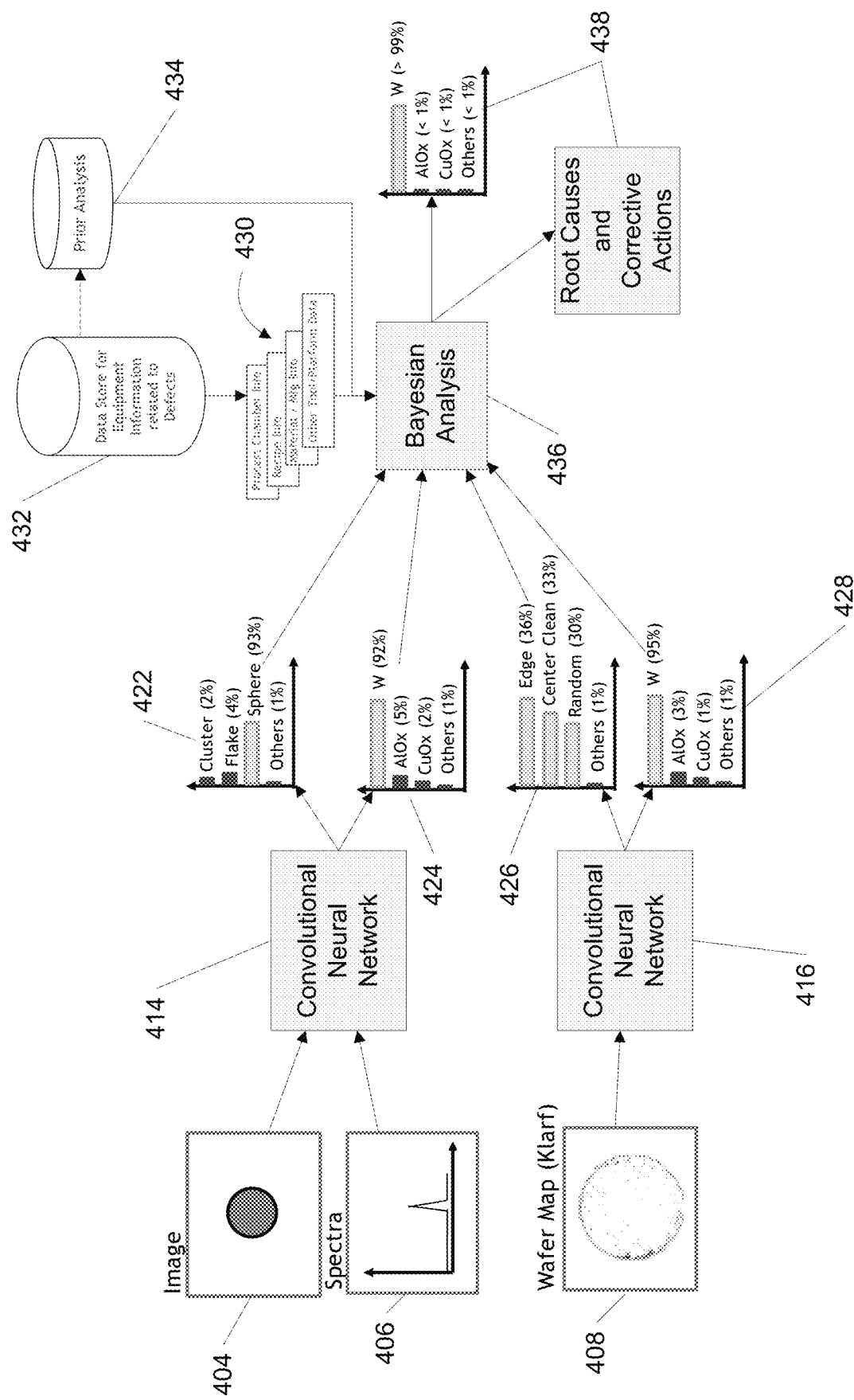
FIG. 4 presents a block diagram for a second example embodiment.

FIG. 4 is a block diagram demonstrating an example process that identifies defects on the wafer as tungsten spheres. As shown, morphology data 404 and spectra data 406 are fed into a convolutional neural network 414, which produces first stage defect classifications 422 and 424. In some embodiments the morphology data is an image, which is processed through convolutional layers of the convolutional neural network. The output of the convolutions may then be fed into a fully connected layer along with the spectra data. The first stage defect classifications 422 and 424 may then include classifications about the composition of the defect, as well as classifying the size and shape of the defect.

In this example, wafer map data 408 is fed into a separate convolutional neural network 416 to produce first stage defect classifications 426 and 428. These classifications are distinct from classifications 422 and 424, even though first stage defect classification 424 and 428 may both suggest potential compositions of the defect. Note that neural network 416 has been trained to output not only a classification of the location/distribution of defects (classification 426) but also a likely classification of the defect composition (classification 428). Both first stage defect classification 424 and first stage defect classification 428 suggest a high probability that the defect contains tungsten, and relatively lower probabilities attributed to the defect containing a different molecule.

A Bayesian analysis engine 436 is then used to analyze the first stage defect classifications along with information from a data store 432 and a prior analysis 434. In this example, Bayesian analysis engine 436 may be considered the sole or primary component of a second stage defect classification engine. As explained above, a data store such as data store 432 may include manufacturing information 430, such as information on the fabrication process, the recipe information, what materials have been deposited or removed by a process, and the historical data of specific tools.

A second stage defect classification 438 is the result of the Bayesian analysis. This is a refined defect classification in that it provides a classification that is more likely correct than any first stage defect classification. In this example there is a very strong probability that tungsten is the principal component of the defect. In some embodiments the second stage defect classification also outputs potential sources of the defects and/or possible remedial action to prevent future occurrences of the defect, such as adjusting a cleaning process after a plasma etching process to completely remove chemicals.

FIG. 5 is an example illustration of metrology data that may be processed by the first and/or second stage defect classification engines. A wafer map 500 shows the location of defects on the substrate. Small particle defects 501 and large particle defects 502 are examples of morphology data that could be collected and processed by a first stage defect classification engine to produce classifications based on size and shape. As chart 505 shows, more than 50% of the particle defects are less than 0.0985 microns, and at least 25% of particle defects are extremely large. Then, a second stage defect classification engine could process that data to further classify the defects or produce one or more likely sources of the defects, such as a wafer clip or a showerhead.

FIG. 6 is an example illustration of linking defects on a substrate with a likely source of the defect. Wafer map 600 has a defect pattern 602 that matches with the contact points of wafer clip 601. A first stage defect classification engine may classify the defect pattern 602 as an edge defect on a specific part of the wafer, while a second stage defect classification would further classify and produce a likely source of the defect as wafer clip 601.

Figure 7A:
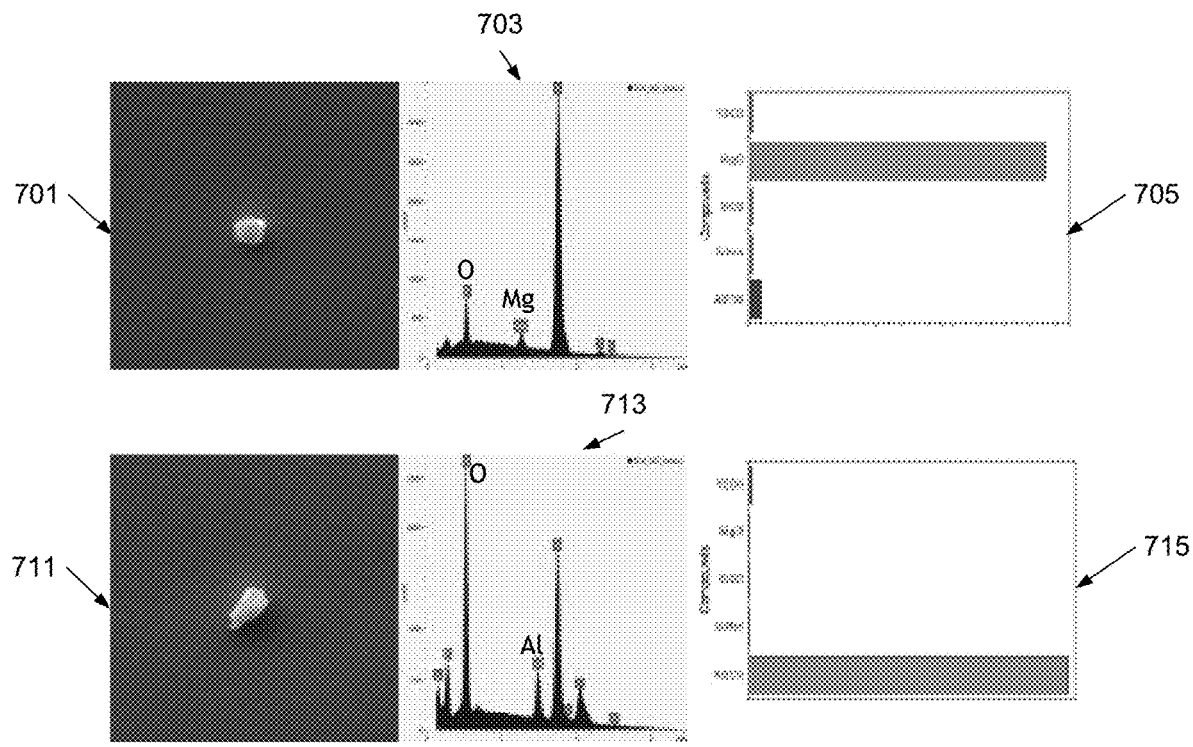
FIG. 7A and FIG. 7B present examples of classifying a defect using image data.
Figure 7B:
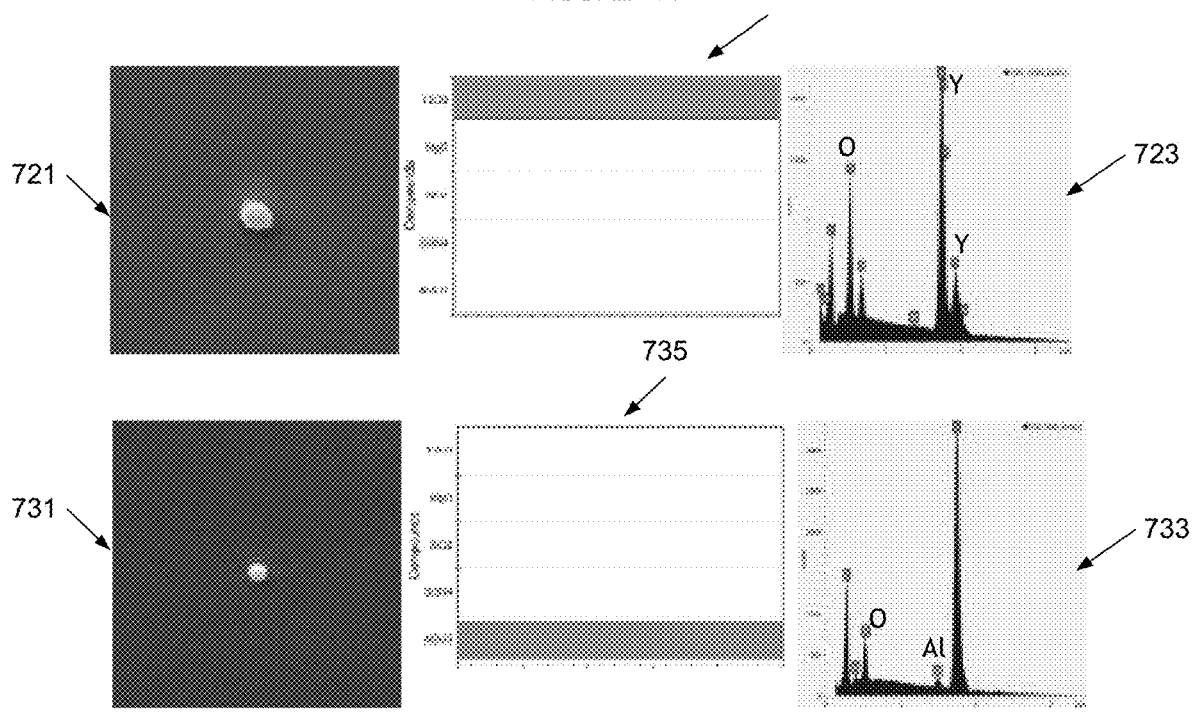

FIGS. 7A and 7B are example illustrations of classifications of defects using only morphology data or morphology data in combination with composition data. In FIG. 7A image 701 and image 711 are each processed by a convolutional neural network (not shown) along with spectra data 703 and spectra data 713 to produce first stage defect classifications 705 and 715.

In FIG. 7B, image 721 and image 731 are each processed by a convolutional neural network (not shown) alone to produce first stage defect classifications 725 and 735 that provide probabilities of a defect's composition. Interestingly, using only images as the input data, the machine learning model was able to output a composition-based classification with a 99.9% probability. EDS-generated spectra 723 and 733 confirmed the first stage defect classifications 725 and 735, respectively. Defect analysis using only image data without collecting spectra data is advantageous because it may be easier and less expensive to collect image data compared to spectra data. Noise or signal overlap in spectra can reduce its utility in classifying defects.

Image data can be difficult to process manually, particularly insofar as it is used to classify defects based their compositions. A highly-trained engineer can learn to classify defect compositions based on their morphology alone, but it requires years to develop such experience. A defect analysis system, on the other hand, can be trained to classify defects as well as an engineer or even better with increased efficiency.

Applications

A defect analysis system as disclosed herein may save time in classifying defects, identifying sources of the defects, and implementing an appropriate remedial action. A defect analysis system can also provide insight for defect sources and remedial action across multiple tools or fleets of tools. For example, a defect analysis system may determine that one cleaning procedure is more effective for aluminum oxide components than another cleaning procedure.

As discussed above, an engineer may spend 23%-34% of their time each year classifying defects, testing remedial actions, and writing reports. A defect analysis system may reduce the time spent on these tasks by up to 70%, resulting in improved efficiency of the engineer's time investigating defects.

A defect analysis system may also be used to suggest preventative maintenance. Components wear and degrade over time or repeated use, resulting in particles that cause defects on the substrate. A defect analysis system may determine that specific defects are more likely to occur after pre-requisite conditions are met, such as a number of uses or combination of different uses, and thus suggest preventative maintenance once such pre-requisite conditions are met. Preventative maintenance may include replacing components or otherwise adjusting the fabrication process in order to eliminate or decrease the number of defects.

The methods and systems of this disclosure may save time and cost by reducing the time spent collecting metrology data, reducing the number of defective wafers produced before correcting a defect, classifying defects faster, identifying root cause and remedial action faster, suggesting solutions across different products with similar components and/or defects, maintaining knowledge in a central data store, etc.

The methods proposed in this work have substantial advantage over the traditional ways of resolving defect issues on semiconductor process equipment. Not only can the methods increase the speed of analysis, which is important towards identifying root causes and solving the problem, but it can also use the prior knowledge of the tool, the platform, and the manufactured components to improve its accuracy.

Context for Disclosed Computational Embodiments

Certain embodiments disclosed herein relate to computational systems for generating and/or using machine learning models. Certain embodiments disclosed herein relate to methods for generating and/or using a machine learning model implemented on such systems. A system for generating a machine learning model may be configured to analyze data for calibrating or optimizing the expressions or relationships used to represent the classification of, source of, or remedies for a defect on a substrate. A system for generating a machine learning model may also be configured to receive data and instructions such as program code representing physical processes occurring during the semiconductor device fabrication operation. In this manner, a machine learning model is generated or programmed on such system. A programmed system for using a machine learning model may be configured to (i) receive input such metrology data of defects on a substrate, and (ii) execute instructions that determine the classification of, source of, or remedies for a defect on the substrate.

Many types of computing systems having any of various computer architectures may be employed as the disclosed systems for implementing machine learning models and algorithms for generating and/or optimizing such models. For example, the systems may include software components executing on one or more general purpose processors or specially designed processors such as Application Specific Integrated Circuits (ASICs) or programmable logic devices (e.g., Field Programmable Gate Arrays (FPGAs)). Further, the systems may be implemented on a single device or distributed across multiple devices. The functions of the computational elements may be merged into one another or further split into multiple sub-modules.

In some embodiments, code executed during generation or execution of a machine learning model on an appropriately programmed system can be embodied in the form of software elements which can be stored in a nonvolatile storage medium (such as optical disk, flash storage device, mobile hard disk, etc.), including a number of instructions for making a computer device (such as personal computers, servers, network equipment, etc.).

At one level a software element is implemented as a set of commands prepared by the programmer/developer. However, the module software that can be executed by the computer hardware is executable code committed to memory using "machine codes" selected from the specific machine language instruction set, or "native instructions," designed into the hardware processor. The machine language instruction set, or native instruction set, is known to, and essentially built into, the hardware processor(s). This is the "language" by which the system and application software communicates with the hardware processors. Each native instruction is a discrete code that is recognized by the processing architecture and that can specify particular registers for arithmetic, addressing, or control functions; particular memory locations or offsets; and particular addressing modes used to interpret operands. More complex operations are built up by combining these simple native instructions, which are executed sequentially, or as otherwise directed by control flow instructions.

The inter-relationship between the executable software instructions and the hardware processor is structural. In other words, the instructions per se are a series of symbols or numeric values. They do not intrinsically convey any information. It is the processor, which by design was preconfigured to interpret the symbols/numeric values, which imparts meaning to the instructions.

The models used herein may be configured to execute on a single machine at a single location, on multiple machines at a single location, or on multiple machines at multiple locations. When multiple machines are employed, the individual machines may be tailored for their particular tasks. For example, operations requiring large blocks of code and/or significant processing capacity may be implemented on large and/or stationary machines.

In addition, certain embodiments relate to tangible and/or non-transitory computer readable media or computer program products that include program instructions and/or data (including data structures) for performing various computer-implemented operations. Examples of computer-readable media include, but are not limited to, semiconductor memory devices, phase-change devices, magnetic media such as disk drives, magnetic tape, optical media such as CDs, magneto-optical media, and hardware devices that are specially configured to store and perform program instructions, such as read-only memory devices (ROM) and random access memory (RAM). The computer readable media may be directly controlled by an end user or the media may be indirectly controlled by the end user. Examples of directly controlled media include the media located at a user facility and/or media that are not shared with other entities. Examples of indirectly controlled media include media that is indirectly accessible to the user via an external network and/or via a service providing shared resources such as the "cloud." Examples of program instructions include both machine code, such as produced by a compiler, and files containing higher level code that may be executed by the computer using an interpreter.

In various embodiments, the data or information employed in the disclosed methods and apparatus is provided in an electronic format. Such data or information may include design layouts, fixed parameter values, floated parameter values, feature profiles, metrology results, and the like. As used herein, data or other information provided in electronic format is available for storage on a machine and transmission between machines. Conventionally, data in electronic format is provided digitally and may be stored as bits and/or bytes in various data structures, lists, databases, etc. The data may be embodied electronically, optically, etc.

In certain embodiments, a machine learning model can each be viewed as a form of application software that interfaces with a user and with system software. System software typically interfaces with computer hardware and associated memory. In certain embodiments, the system software includes operating system software and/or firmware, as well as any middleware and drivers installed in the system. The system software provides basic non-task-specific functions of the computer. In contrast, the modules and other application software are used to accomplish specific tasks. Each native instruction for a module is stored in a memory device and is represented by a numeric value.

Figure 8:
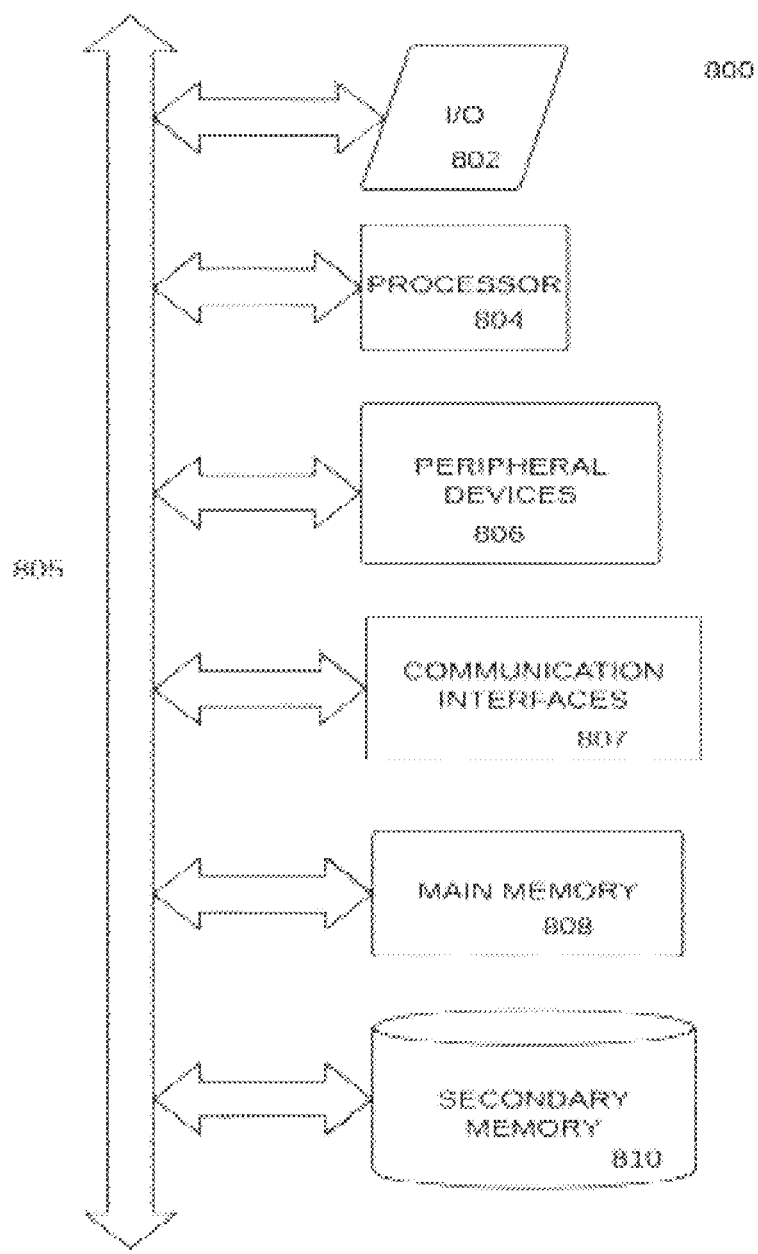
FIG. 8 presents an example computer system that may be employed to implement certain embodiments described herein.

An example computer system 800 is depicted in FIG. 8. As shown, computer system 800 includes an input/output subsystem 802, which may implement an interface for interacting with human users and/or other computer systems depending upon the application. Embodiments of the invention may be implemented in program code on system 800 with I/O subsystem 802 used to receive input program statements and/or data from a human user (e.g., via a GUI or keyboard) and to display them back to the user. The I/O subsystem 802 may include, e.g., a keyboard, mouse, graphical user interface, touchscreen, or other interfaces for input, and, e.g., an LED or other flat screen display, or other interfaces for output. Other elements of embodiments of the disclosure, such as the order placement engine 208, may be implemented with a computer system like that of computer system 800, perhaps, however, without I/O.

Program code may be stored in non-transitory media such as persistent storage 810 or memory 808 or both. One or more processors 804 reads program code from one or more non-transitory media and executes the code to enable the computer system to accomplish the methods performed by the embodiments herein, such as those involved with generating or using a process simulation model as described herein. Those skilled in the art will understand that the processor may accept source code, such as statements for executing training and/or modelling operations, and interpret or compile the source code into machine code that is understandable at the hardware gate level of the processor. A bus couples the I/O subsystem 802, the processor 804, peripheral devices 806, memory 808, and persistent storage 810.

CONCLUSION

In the description, numerous specific details were set forth in order to provide a thorough understanding of the presented embodiments. The disclosed embodiments may be practiced without some or all of these specific details. In other instances, well-known process operations were not described in detail to not unnecessarily obscure the disclosed embodiments. While the disclosed embodiments were described in conjunction with the specific embodiments, it will be understood that the specific embodiments are not intended to limit the disclosed embodiments.

Unless otherwise indicated, the method operations and device features disclosed herein involves techniques and apparatus commonly used in metrology, semiconductor device fabrication technology, software design and programming, and statistics, which are within the skill of the art.

Unless defined otherwise herein, all technical and scientific terms used herein have the same meaning as commonly understood by one of ordinary skill in the art. Various scientific dictionaries that include the terms included herein are well known and available to those in the art. Although any methods and materials similar or equivalent to those described herein find use in the practice or testing of the embodiments disclosed herein, some methods and materials are described.

Numeric ranges are inclusive of the numbers defining the range. It is intended that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

The headings provided herein are not intended to limit the disclosure.

As used herein, the singular terms "a," "an," and "the" include the plural reference unless the context clearly indicates otherwise. The term "or" as used herein, refers to a non-exclusive or, unless otherwise indicated.

What is claimed is:

1. A defect analysis computational system comprising:
   (a) one or more processors;
   (b) program instructions for executing on the one or more processors, the program instructions defining:
      one or more first stage defect classification engines configured to:
         receive metrology data acquired for defects on a substrate comprising electronic devices or partially fabricated electronic devices, wherein the metrology data includes an image, composition data, and/or a wafer map, and
         produce a first stage defect classification from the metrology data; and
      a second stage defect classification engine configured to:
         receive the first stage defect classification produced by the one or more first stage defect classification engines,
         receive manufacturing information comprising data about (i) a plurality of materials on the substrate, and (ii) prior defect classification for a manufacturing equipment and/or fabrication process,
         determine, using the first stage defect classification and the manufacturing information, one or more sources of the defects on the substrate, and
         output a likelihood of the defects being caused by a first source associated with the manufacturing equipment, one or more materials on the substrate, and/or fabrication process.

2. The defect analysis computational system of claim 1, wherein the metrology data comprises the image, the composition data, and the wafer map.

3. The defect analysis computational system of claim 1, wherein the metrology data comprises metadata pertaining to an inspection tool used in obtaining the metrology data.

4. The defect analysis computational system of claim 1, wherein the first stage defect classification comprises a morphology classification for the defects on the substrate.

5. The defect analysis computational system of claim 1, wherein the first stage defect classification comprises a composition classification for the defects on the substrate.

6. The defect analysis computational system of claim 1, wherein the first stage defect classification comprises a wafer map classification for the defects on the substrate.

7. The defect analysis computational system of claim 1, wherein the first stage defect classification engine comprises one or more neural networks.

8. The defect analysis computational system of claim 1, wherein the manufacturing equipment is a dry etch reactor, a chemical vapor deposition reactor, an atomic layer deposition reactor, a physical vapor deposition reactor, or an electroplating reactor.

9. The defect analysis computational system of claim 1, wherein the second stage defect classification engine is additionally configured to further classify the defects on the substrate.

10. The defect analysis computational system of claim 1, wherein the second stage defect classification engine is additionally configured to provide suggested corrective actions to reduce generation of defects on the substrate and/or reduce occurrences of defects on substrates processed in the future.

11. The defect analysis computational system of claim 1, wherein the second stage defect classification engine is configured to determine the one or more sources of defects on the substrate by using a Bayesian analysis.

12. The defect analysis computational system of claim 1, wherein the metrology data was obtained in situ during the fabrication process.

13. The defect analysis computational system of claim 1, wherein the one or more first stage defect classification engines are further configured to receive sensor data selected from the group consisting of environmental conditions of the fabrication process, change in the mass of the substrate during the fabrication process, mechanical forces experienced during the fabrication process, and combinations thereof, and wherein the second stage defect classification engine is further configured to determine the one or more sources of defects on the substrate using the sensor data.

14. A computational method of analyzing defects, the method comprising:
    receiving metrology data acquired for defects on a substrate comprising electronic devices or partially fabricated electronic devices, wherein the metrology data includes an image, composition data, and/or a wafer map;
    producing a first stage defect classification from the metrology data;
    receiving manufacturing information comprising data (i) a plurality of materials on the substrate, and (ii) prior defect classification for a manufacturing equipment and/or fabrication process,
    determining, using the first stage defect classification and the manufacturing information, one or more likely sources of the defects on the substrate, and
    outputting a likelihood of the defects being caused by a first source associated with the manufacturing equipment, one or more materials on the substrate, and/or fabrication process.

15. The method of claim 14 wherein the metrology data comprises the image, the composition data, and the wafer map.

16. The method of claim 14, wherein the metrology data comprises metadata pertaining to an inspection tool used in obtaining the metrology data.

17. The method of claim 14, wherein the first stage defect classification comprises a morphology classification for the defects on the substrate.

18. The method of claim 14, wherein the first stage defect classification comprises a composition classification for the defects on the substrate.

19. The method of claim 14, wherein the first stage defect classification comprises a wafer map classification for the defects on the substrate.

20. The method of claim 14, wherein one or more neural networks produce the first stage defect classification from the metrology data.

21. The method of claim 14, wherein the manufacturing equipment is a dry etch reactor, a chemical vapor deposition reactor, an atomic layer deposition reactor, a physical vapor deposition reactor, or an electroplating reactor.

22. The method of claim 14, further comprising using the first stage defect classification and the manufacturing information, further classifying the defect on the substrate.

23. The method of claim 14, further comprising using the first stage defect classification and the manufacturing information, providing suggested corrective actions to reduce generation of defects on the substrate and/or reduce occurrences of defects on substrates processed in the future.

24. The method of claim 14, wherein determining one or more likely sources of the defects on the substrate comprises performing a Bayesian analysis.

25. The method of claim 14, wherein the metrology data was obtained in situ during the fabrication process.

26. The method of claim 14, further comprising receiving sensor data selected from the group consisting of environmental conditions of the fabrication process, change in the mass of the substrate during the fabrication process, mechanical forces experienced during the fabrication process, and combinations thereof, and determining the one or more likely sources of the defects on the substrate using the sensor data.

27. A computer program product for analyzing defects, the computer program product comprising a non-transitory computer readable medium on which is provided computer executable instructions for:
    receiving metrology data acquired for defects on a substrate comprising electronic devices or partially fabricated electronic devices, wherein the metrology data includes an image, composition data, and/or a wafer map;
    producing a first stage defect classification from the metrology data;
    receiving manufacturing information comprising data about (i) a plurality of materials on the substrate, and (ii) prior defect classification for a manufacturing equipment and/or fabrication process,
    determining, using the first stage defect classification and the manufacturing information, one or more likely sources of the defects on the substrate, and
    outputting a likelihood of the defects being caused by a first source associated with the manufacturing equipment, one or more materials on the substrate, and/or fabrication process.

28. The computer program product of claim 27, wherein the metrology data comprises the image, the composition data, and the wafer map.

29. The computer program product of claim 27, wherein the metrology data comprises metadata pertaining to an inspection tool used in obtaining the metrology data.

30. The computer program product of claim 27, wherein the first stage defect classification comprises a morphology classification for the defects on the substrate.

31. The computer program product of claim 27, wherein the first stage defect classification comprises a composition classification for the defects on the substrate.

32. The computer program product of claim 27, wherein the first stage defect classification comprises a wafer map classification for the defects on the substrate.

33. The computer program product of claim 27, wherein the computer executable instructions for producing the first stage defect classification from the metrology data comprise computer executable instructions for processing the metrology data on one or more neural networks.

34. The computer program product of claim 27, wherein the manufacturing equipment is a dry etch reactor, a chemical vapor deposition reactor, an atomic layer deposition reactor, a physical vapor deposition reactor, or an electroplating reactor.

35. The computer program product of claim 27, wherein the computer executable instructions for determining the one or more likely sources of the defects on the substrate comprise instructions for further classifying, beyond the first stage defect classification, the defects on the substrate.

36. The computer program product of claim 27, further comprising computer executable instructions for providing suggested corrective actions to reduce generation of defects on the substrate and/or reduce occurrences of defects on substrates processed in the future.

37. The computer program product of claim 27, wherein the computer executable instructions for determining the one or more likely sources of the defects on the substrate comprise computer executable instructions for conducting a Bayesian analysis.

38. The computer program product of claim 27, wherein the metrology data was obtained in situ during the fabrication process.

39. The computer program product of claim 27, wherein the computer executable instructions for producing the first stage defect classification comprise computer executable instructions for receiving sensor data selected from the group consisting of environmental conditions of the fabrication process, change in the mass of the substrate during the fabrication process, mechanical forces experienced during the fabrication process, and combinations thereof, and wherein the instructions for determining the one or more likely sources of the defects on the substrate comprise instructions using the sensor data.

40. The computer program product of claim 27, further comprising computer executable instructions for using the likelihood of the defects being caused by a first source associated with the manufacturing equipment and/or fabrication process to generate a digital twin of the manufacturing equipment and/or fabrication process.

\* \* \* \* \*